United States Patent
Kim et al.

(10) Patent No.: US 9,654,077 B2
(45) Date of Patent: May 16, 2017

(54) METHOD AND APPARATUS FOR REDUCING NOISE DUE TO PATH CHANGE OF AUDIO SIGNAL

(71) Applicant: Samsung Electronics Co., Ltd., Gyeonggi-do (KR)

(72) Inventors: Jung-In Kim, Gyeonggi-do (KR); Yong-Won Shin, Gyeonggi-do (KR); Tae-Kyun Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/695,815

(22) Filed: Apr. 24, 2015

(65) Prior Publication Data
US 2016/0099698 A1 Apr. 7, 2016

(30) Foreign Application Priority Data
Oct. 2, 2014 (KR) ........................ 10-2014-0133151

(51) Int. Cl.
*H04B 15/00* (2006.01)
*H03G 3/34* (2006.01)
*G10L 21/0216* (2013.01)

(52) U.S. Cl.
CPC ......... *H03G 3/348* (2013.01); *G10L 21/0216* (2013.01)

(58) Field of Classification Search
CPC ............................ H03G 3/348; G10L 21/0216
See application file for complete search history.

(56) References Cited

U.S. PATENT DOCUMENTS

| 7,689,192 B2 * | 3/2010 | Saito | H04B 1/1676 |
| | | | 455/222 |
| 2003/0022650 A1 * | 1/2003 | Tsuji | H04B 7/005 |
| | | | 455/296 |
| 2012/0033827 A1 * | 2/2012 | Murata | G10K 11/1782 |
| | | | 381/94.1 |
| 2012/0265534 A1 | 10/2012 | Coorman et al. | |

FOREIGN PATENT DOCUMENTS

WO     WO 2007008832 A2 *   1/2007 ............... H04B 3/23

* cited by examiner

*Primary Examiner* — Regina N. Holder
(74) *Attorney, Agent, or Firm* — The Farrell Law Firm, P.C.

(57) ABSTRACT

A method and an apparatus for reducing noise due to a path change of an audio signal output from a device are provided. The method includes determining an input period for canceling the noise by using a time point, at which the path change is sensed, as a reference, when sensing the path change of the audio signal; low-pass filtering the audio signal in the determined input period; and interpolating a first partial signal, which is the low-pass filtered audio signal in a first predetermined period that starts from a start time point of the determined input period, and a second partial signal, which is the low-pass filtered audio signal in a second predetermined period that ends at an end time point of the determined input period, within the determined input period.

10 Claims, 6 Drawing Sheets

METHOD AND APPARATUS FOR REDUCING NOISE DUE TO PATH CHANGE OF AUDIO SIGNAL

PRIORITY

This application claims priority under 35 U.S.C. §119(a) to Korean Patent Application Serial No. 10-2014-0133151, which was filed in the Korean Intellectual Property Office on Oct. 2, 2014, the entire content of which is incorporated herein by reference.

BACKGROUND

1. Field of the Disclosure

The present disclosure generally relates to a method and an apparatus for reducing noise due to a path change of an audio signal.

2. Description of the Related Art

With the progress and diversification of wireless communication technology, a user can receive an audio signal by connecting various devices (e.g., a handset, a speaker phone, a headset, an earphone, etc.) to an audio signal output apparatus. At this time, a speech enhancement algorithm can be used to enhance the quality of the audio signal, which is to be heard by a user. The speech enhancement algorithm operates by applying a different parameter, which is pre-stored in each device, to each device.

FIG. 1 is a graph illustrating an example of an output waveform in the case of applying a typical speech enhancement algorithm.

Referring to FIG. 1, for example, a user first reproduces an audio signal by using a handset in a mobile communication terminal, and the user removes the handset connected to the mobile communication terminal at a time point 100 and then reproduces an audio signal by using a speaker phone. In this case, according to a change in an audio path of an audio signal which is output from the mobile communication terminal, the speech enhancement algorithm, which is being driven to apply a corresponding parameter to the handset, changes the parameter corresponding to the handset to a pre-stored parameter corresponding to the speaker phone, and applies the changed parameter to the speaker phone. Accordingly, as illustrated in FIG. 1, a discontinuous period 102 occurs in frames before and after the time point 100. During the discontinuous period 102, the discontinuity of an audio signal generates a high frequency component, and the generated high frequency component generates a tick or clicking noise and the like. Therefore, the tick noise and the like may be unpleasant to the user.

SUMMARY

The present disclosure has been made to solve the above-mentioned problem and/or disadvantages and to provide at least advantages described below. Accordingly, an aspect of the present disclosure is to provide a method and an apparatus for reducing noise generated due to a path change of an audio signal.

In accordance with an aspect of the present disclosure, a method for reducing noise due to a path change of an audio signal is provided. The method includes determining an input period for canceling the noise by using a time point, at which the path change is sensed, as a reference, when sensing the path change of the audio signal; low-pass filtering the audio signal in the determined input period; and interpolating a first partial signal, which is the low-pass filtered audio signal in a first predetermined period that starts from a start time point of the determined input period, and a second partial signal, which is the low-pass filtered audio signal in a second predetermined period that ends at an end time point of the determined input period, within the determined input period.

In accordance with another aspect of the present disclosure, an apparatus for reducing noise due to a path change of an audio signal is provided. The apparatus includes a controller configured to determine an input period for canceling the noise by using a time point, at which the path change is sensed, as a reference, when sensing the path change of the audio signal; a filter configured to low-pass filter the audio signal in the determined input period; and an interpolator configured to interpolate a first partial signal, which is the low-pass filtered audio signal in a predetermined period that starts from a start time point of the determined input period, and to interpolate a second partial signal, which is the low-pass filtered audio signal in a second predetermined period that ends at an end time point of the determined input period, within the determined input period.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
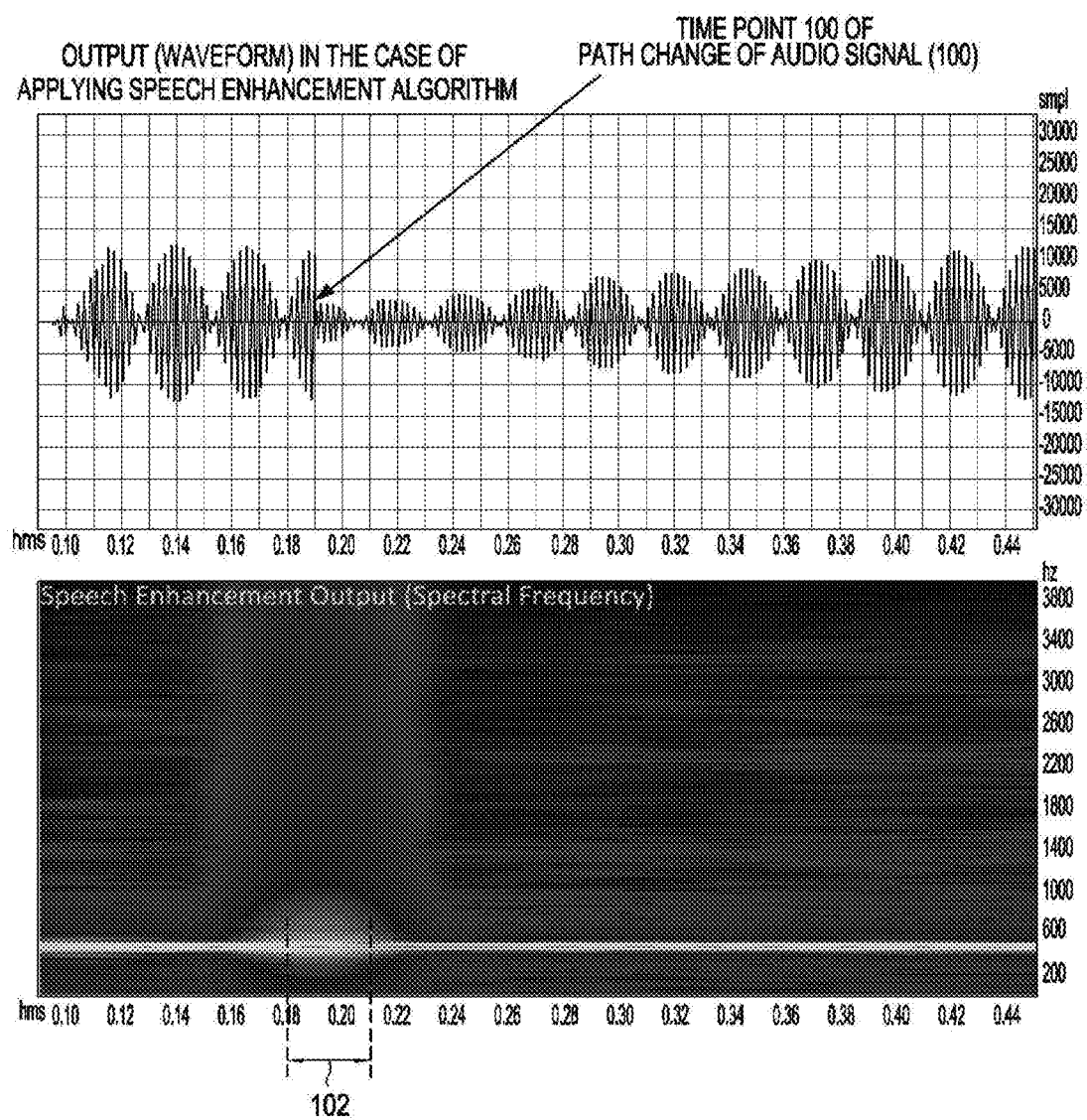
FIG. 1 is a graph illustrating an example of an output waveform in the case of applying a typical speech enhancement algorithm.

Hereinafter, an operation principle of embodiments of the present disclosure will be described in detail with reference to the accompanying drawings. Like reference numerals designate like components in the drawings where possible even though components are shown in different drawings. In the following description of the present disclosure, a detailed description of related known functions or configurations will be omitted so as not to obscure the subject matter of the present disclosure. The terms described hereinafter are defined in consideration of the functions of the present disclosure, but may vary according to the intention or convention of a user or operator. Therefore, the definitions of the terms should be determined based on the contents throughout the specification.

Hereinafter, embodiments of the present disclosure provide a method and an apparatus for canceling a tick or clicking noise generated when a path of an audio signal changes. When a path of an audio signal changes, for example, when an earphone, speaker, or microphone is being connected to a cell phone, the generated audio is the tick or clicking noise.

According to embodiments of the present disclosure, the audio signal output apparatus, that allows a speech enhancement algorithm to operate, determines an input period during which noise is generated, and when a path of an audio signal changes, performs low-pass filtering, interpolation, amplitude control, and the like, during the determined input period, and effectively reduces noise. Therefore, the degradation of voice quality due to the noise can be prevented.

Figure 2:
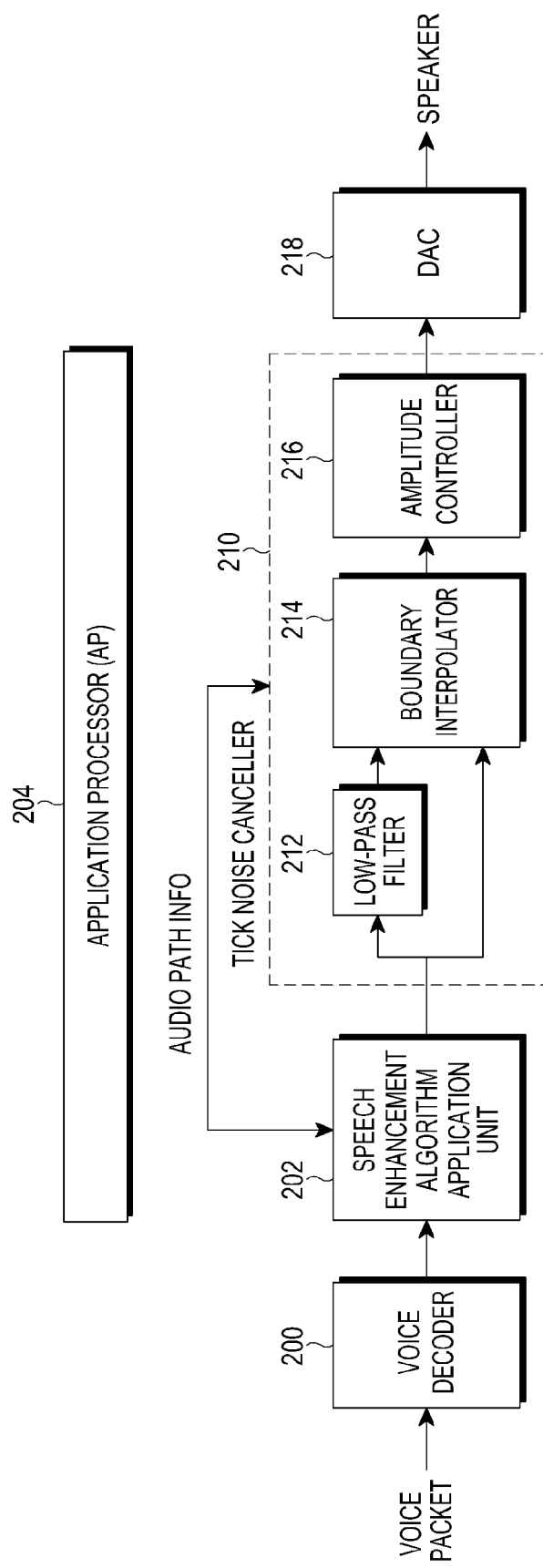
FIG. 2 is a block diagram illustrating a configuration of a downlink voice signal processing block according to an embodiment of the present disclosure.

FIG. 2 is a block diagram illustrating a configuration of a downlink voice signal processing block according to an embodiment of the present disclosure. According to an embodiment of the present disclosure, the voice signal processing block illustrated in FIG. 2 may be implemented within an audio signal output apparatus. Examples of the audio signal output apparatus may include sound reproduction apparatuses (e.g., radios, Moving Picture Experts Group (MPEG-1) Layer-3 (MP3) players, Compact Disc (CD) players, etc.), wireless communication apparatuses, apparatuses capable of using multimedia data, game consoles, and the like. Here, the audio signal output apparatus may provide a function for connecting to the various devices (e.g., a handset, a speaker phone, a headset, an earphone, etc.) and thereby may deliver an audio signal to a user in various schemes.

The downlink voice signal processing block according to an embodiment of the present disclosure includes a voice decoder 200, a speech enhancement algorithm application unit 202, an Application Processor (AP) 204, and a tick noise canceller 210, and may further include a Digital to Analog Converter (DAC) 218.

The voice decoder 200 converts a received voice packet into a Pulse Code Modulation (PCM) signal. Then, the speech enhancement algorithm application unit 202 converts the PCM signal into a quality-enhanced audio signal by using a speech enhancement algorithm and outputs the converted audio signal. Specifically, the speech enhancement algorithm application unit 202 acquires audio path information of the input voice signal through the Application Processor (AP) 204. Then, the speech enhancement algorithm application unit 202 converts the PCM signal by using a parameter of a device which corresponds to the acquired audio path information among pre-stored device-specific parameters.

According to an embodiment of the present disclosure, the tick noise canceller 210 is placed after the speech enhancement algorithm application unit 202 in accordance with a sequence for processing the signal. According to an embodiment of the present disclosure, the tick noise canceller 210 includes, for example, a low-pass filter 212, a boundary interpolator 214, and an amplitude controller 216.

The tick noise canceller 210 first receives the audio path information from the AP 204 and senses a change in an audio path of a voice signal. For example, an audio path of a voice signal, which has been set for a handset, changes from the handset to a speaker. Then, the tick noise canceller 210 cancels a tick or clicking noise generated due to the change in the audio path by using the PCM signal which has been output from the speech enhancement algorithm application unit 202 and the audio path information.

In an embodiment of the present disclosure, the tick noise canceller 210 operates in the order of the low-pass filter 212, the boundary interpolator 214 and the amplitude controller 216. In another embodiment of the present disclosure, a method for canceling tick noise may be performed only through the low-pass filter 212 and the boundary interpolator 214.

The DAC 218 converts the signal output from the tick noise canceller 210 into an analog signal so that the analog signal can be output through a speaker.

FIGS. 3A to 3D are graphs illustrating an example of an output waveform generated in a tick noise cancellation process performed by the tick noise canceller 210 according to an embodiment of the present disclosure.

Figure 3A:
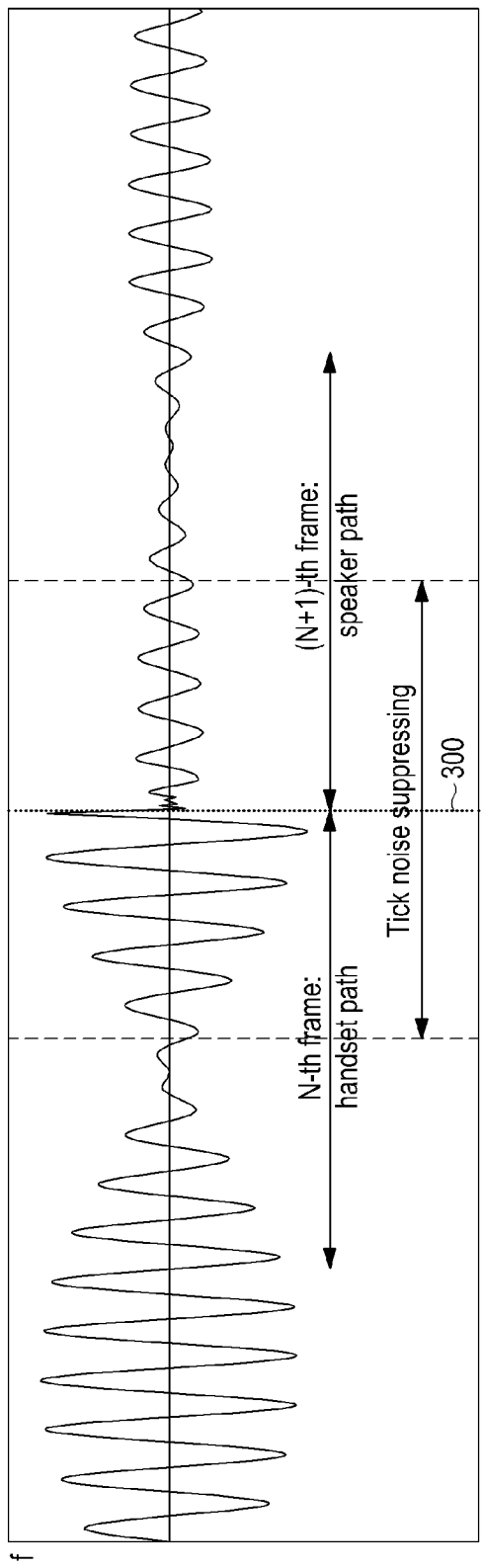
FIG. 3A is a graph illustrating an example of a waveform generated when a path of an audio signal changes such that a voice signal which had been output through a handset, has been changed to be output through a speaker phone, according to an embodiment of the present disclosure.

In FIG. 3A, a waveform is generated when a path of a voice signal changes due to the voice signal which had been output through the handset, being changed to be output through the speaker phone at a time point 300. Referring to FIG. 3A, it can be noted that, starting from the time point 300, which is the occurrence of the audio path change, there is an abrupt change between a waveform in an N-th frame immediately before the audio path change and a waveform in an (N+1)-th frame immediately after the audio path change. Accordingly, the method for canceling tick noise, according to an embodiment of the present disclosure, is performed in a predetermined range (e.g., over the N-th frame and the (N+1)-th frame) regarding the time point 300.

Figure 3B:
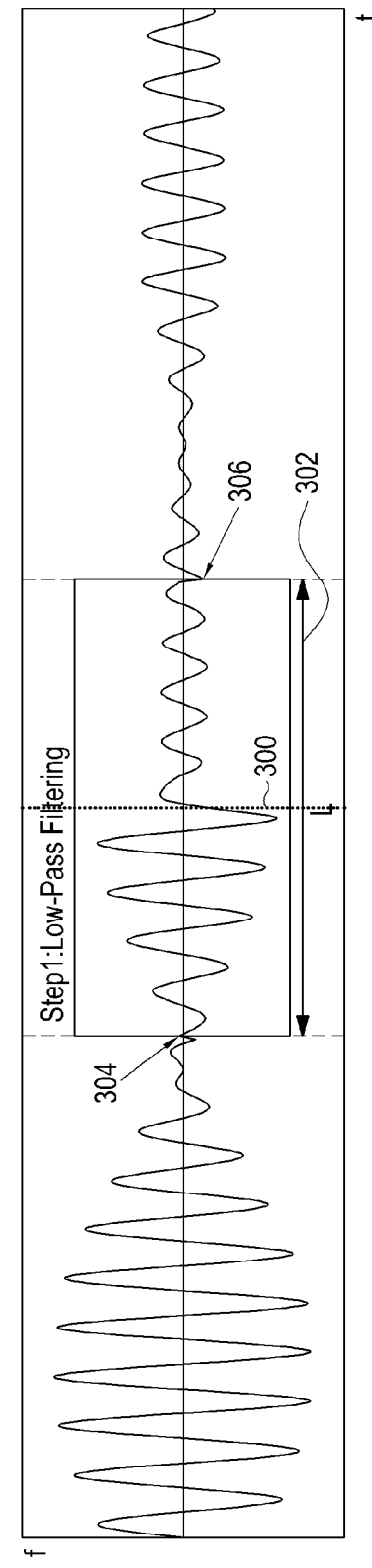
FIG. 3B is a graph illustrating an example of an output waveform from a low-pass filter according to an embodiment of the present disclosure.

FIG. 3B is a graph illustrating an example of an output waveform from a low-pass filter (indicated by reference numeral 212 as shown in FIG. 2) according to an embodiment of the present disclosure.

The low-pass filter 212 low-pass filters, as expressed in Equation (1), a total number L of samples of signals, which are PCM signals that have been output from the speech enhancement algorithm application unit 202. The L samples correspond to part of the N-th frame and part of the (N+1)-th frame with the time point 300 as a reference.

$$y_f(n)=\text{filter}(x(n)), n=0, 1, \ldots, L+1 \quad \text{Equation (1)}$$

In Equation (1), $y_f(n)$ represents a low-pass filtered output signal, and $x(n)$ represents a n-th sample of a signal being filtered.

As a result, the low-pass filter 212 removes high frequency components due to a discontinuous signal between the N-th frame and the (N+1)-th frame. Specifically, referring to FIG. 3B, it can be noted that, as compared with the output waveform illustrated in FIG. 3A, the high frequency components have been removed from a low-pass filtered output waveform at a period 302, corresponding to the L number of samples. Accordingly, the high frequency components have been removed at the period 302, but discontinuity occurs between waveforms before and after the filtering at a start point 304 of the period 302. Similarly, discontinuity occurs between waveforms before and after the filtering at an end point 306 of the period 302.

Figure 3C:
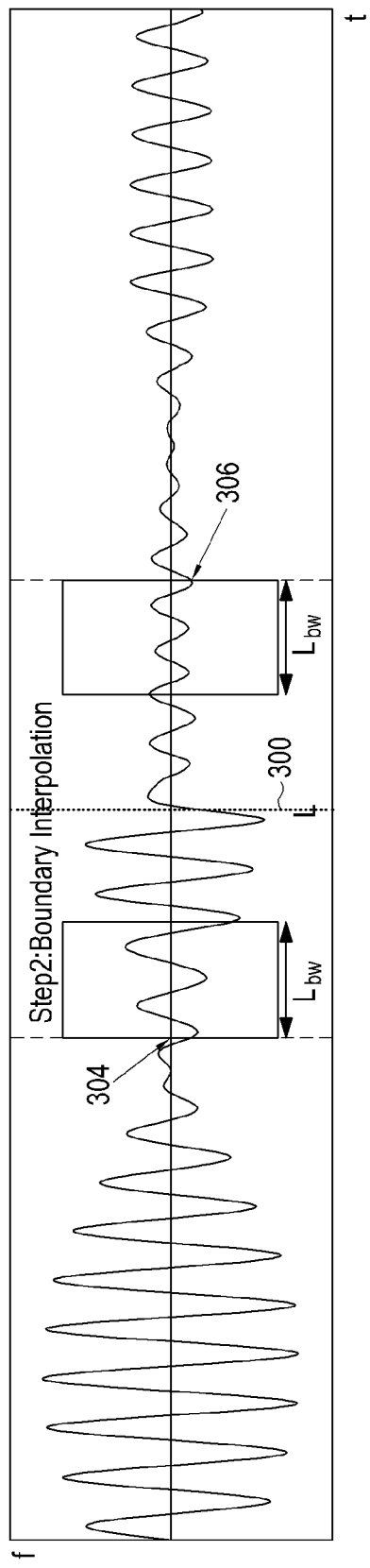
FIG. 3C is a graph illustrating an example of an output waveform from a boundary interpolator according to an embodiment of the present disclosure.

FIG. 3C is a graph illustrating an example of an output signal from a boundary interpolator (indicated by reference numeral 214 as shown in FIG. 2) according to an embodiment of the present disclosure.

In an embodiment of the present disclosure, the boundary interpolator 214 serves to reduce the discontinuity at each of the points 304 and 306. According to an embodiment of the present disclosure, the boundary interpolator 214 performs, as expressed in Equation (2), boundary interpolation on samples with an $L_{bw}$ number of samples. Here, the $L_{bw}$ samples start from the start point 304 of the period 302. Similarly, the boundary interpolator 214 performs, as expressed in Equation (2), boundary interpolation on samples with an $L_{bw}$ number of samples. Here, the $L_{bw}$ samples end at the end point 306 of the period 302.

$$y_{bw}(n) = \begin{cases} \dfrac{x(n)\beta(k) + y_f(n)\alpha(k)}{L_{bw}}, & \text{if } 0 \leq n < L_{bw} \\ y_f(n), & \text{if } L_{bw} \leq n < L - L_{bw} \\ \dfrac{x(n)\alpha(k) + y_f(n)\beta(k)}{L_{bw}}, & \text{if } L - L_{bw} \leq n < L \end{cases} \quad \text{Equation (2)}$$

where, $$\begin{cases} \alpha(k) = k, & k = 0, 1, \ldots, L_{bw} - 1 \\ \beta(k) = L_{bw} - \alpha(k), & k = 0, 1, \ldots, L_{bw} - 1 \end{cases}$$

In Equation (2), $y_{bw}(n)$ represents an output signal from the boundary interpolator 214.

Referring to FIG. 3C, the boundary interpolator 214 does not perform boundary interpolation during a remaining period (i.e., a period corresponding to $L_{bw} \leq n < L - L_{bw}$) except for a period corresponding to the $L_{bw}$ samples after the start point 304 of the period 302 and a period corresponding to the $L_{bw}$ samples before the end point 306. Accordingly, the signals in the remaining period is identical to that of an output from Equation (1).

Figure 3D:
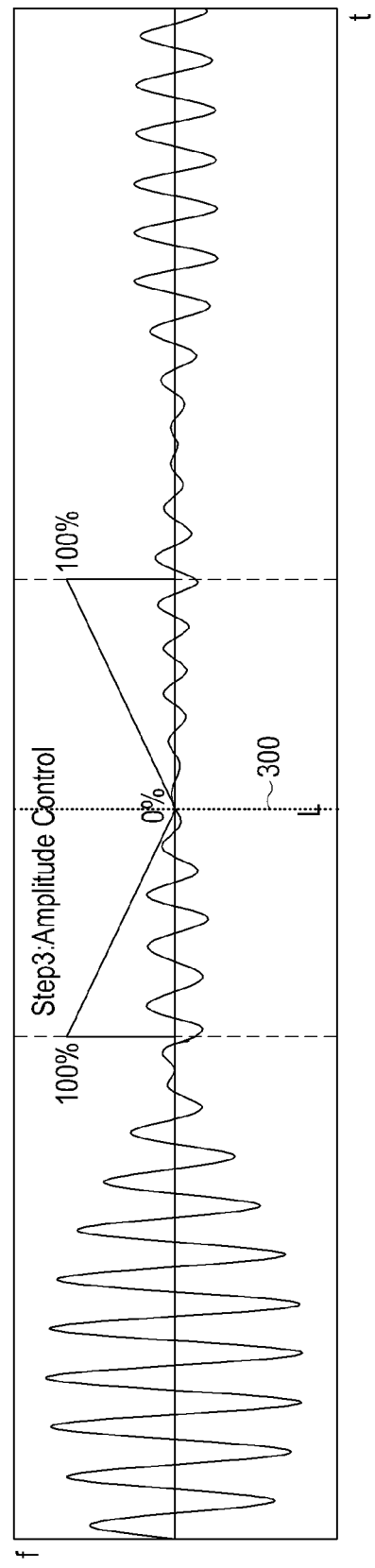
FIG. 3D is a graph illustrating an example of an output waveform from an amplitude controller according to an embodiment of the present disclosure.

FIG. 3D is a graph illustrating an example of an output waveform from an amplitude controller (indicated by reference numeral 216 as shown in FIG. 2) according to an embodiment of the present disclosure.

The amplitude controller 216, according to an embodiment of the present disclosure, performs amplitude control, in order to compensate for the the previously-performed low-pass filtering and remove the unnaturalness of the user's voice due to the previously-performed low-pass filtering. Referring to FIG. 3D, the amplitude controller 216 adjusts a signal level by using Equation (3) in the period 302.

$$y(n) = \begin{cases} y_{bw}(n)\left(1 - \dfrac{2m}{L}\right), & \text{if } 0 \leq n < \dfrac{L}{2}, m = 1, 2, \ldots, \dfrac{L}{2} \\ y_{bw}(n)\left(\dfrac{2m}{L}\right), & \text{if } \dfrac{L}{2} \leq n < L, m = 1, 2, \ldots, \dfrac{L}{2} \end{cases} \quad \text{Equation (3)}$$

The amplitude controller 216 controls amplitudes of samples after dividing the period 302, which corresponds to the L number of samples, into two parts. Specifically, the amplitude controller 216 adjusts an amplitude of a signal corresponding to $$0 \leq n < \frac{L}{2}$$

within the period 302 to be close to zero (100%→0%). Also, the amplitude controller 216 adjusts an amplitude of a signal corresponding to $$\frac{L}{2} \leq n < L$$

within the period 302 to arrive at the original amplitude (0%→100%).

Figure 4:
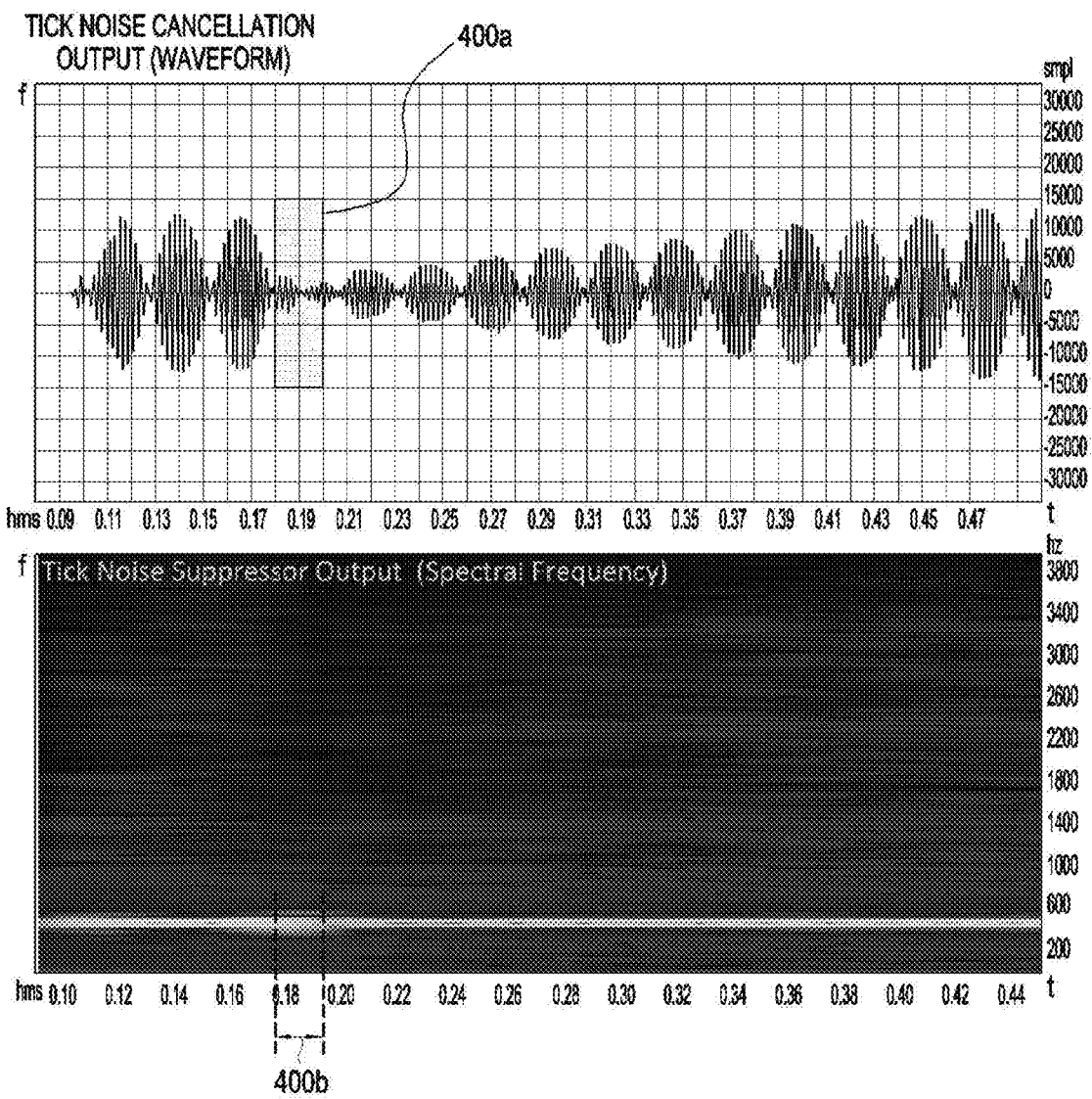
FIG. 4 is a graph illustrating an example of an output waveform obtained by canceling tick noise according to an embodiment of the present disclosure.

FIG. 4 is a graph illustrating an example of an output waveform obtained by canceling tick noise according to an embodiment of the present disclosure.

Referring to FIG. 4, it can be noted that the discontinuity of an output signal is reduced and high frequency components thereof are removed during a period 400a or 400b, which is the occurrence of an audio path change, when a method for canceling tick noise is performed according to an embodiment of the present disclosure.

Figure 5:
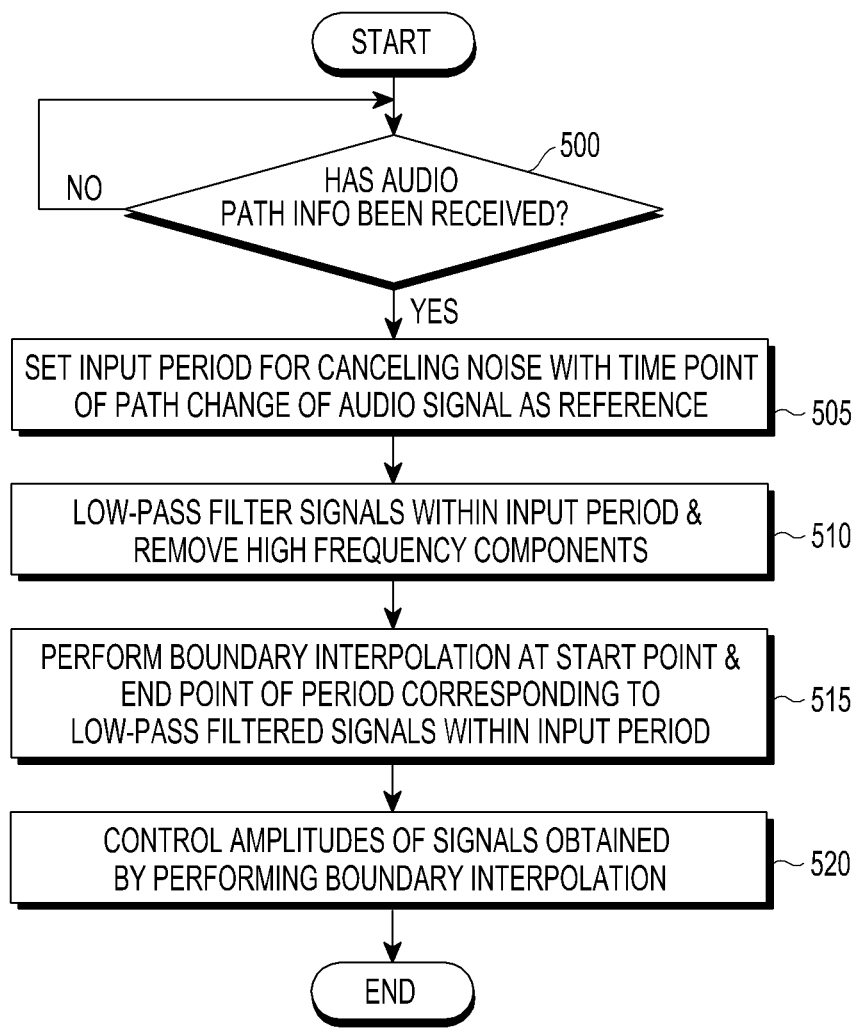
FIG. 5 is a flowchart illustrating a method for canceling tick noise according to embodiment of the present disclosure.

FIG. 5 is a flowchart illustrating a method for canceling tick noise according to embodiment of the present disclosure.

Referring to FIG. 5, in step 500, the tick noise canceller 210 determines whether audio path information indicating a change in a path of an audio signal has been received from the AP 204. When the audio path information has not been received, the tick noise canceller 210 stands by until the audio path information is received.

When it is determined that the audio path information is received, in step 505, the tick noise canceller 210 determines or sets an input period for canceling noise by using a time point of the change in the path of the audio signal as a reference. Here, the input period may be set for a frame before the reference and a frame after the reference, as described above.

In step 510, the low-pass filter 212 low-pass filters signals within the set input period and thereby removes high frequency components, as expressed in Equation (1). (See FIG. 3B.)

In step 515, the boundary interpolator 214 performs boundary interpolation as expressed in Equation (2) in order to reduce discontinuity which occurs at each of a start point and an end point of the set input period. (See FIG. 3C.)

In step 520, the amplitude controller 216 controls an amplitude of an output waveform of the signals by performing the boundary interpolation. (See FIG. 3D.)

According to an embodiment of the present disclosure, the method for canceling noise due to a path change of an audio signal may perform only steps 505 to 515, or may additionally perform the amplitude control operation indicated in step 520.

While the present disclosure has been shown and described with reference to certain embodiments thereof, it will be understood by those skilled in the art that various changes in form and details may be made therein without departing from the scope of the present disclosure. Thus, the scope of the present disclosure shall not be determined merely based on the described embodiments and rather determined based on the appended claims and the equivalents thereto.

What is claimed is:

1. A method for reducing noise due to a change of a path for outputting an audio signal from a device, the method comprising:
   determining an input period for canceling the noise by using a time point, at which the change of the path for outputting the audio signal from the device is sensed, as a reference, when sensing the change of the path;
   low-pass filtering the audio signal in the determined input period; and
   interpolating a first partial signal, which is the low-pass filtered audio signal in a first predetermined period that starts from a start time point of the determined input period, and a second partial signal, which is the low-pass filtered audio signal in a second predetermined period that ends at an end time point of the determined input period, within the determined input period.

2. The method as claimed in claim 1, wherein interpolating the first partial signal and the second partial signal comprises keeping a remaining signal except for the first partial signal and the second partial signal to be unchanged from the audio signal low-pass filtered in the determined input period.

3. The method as claimed in claim 2, further comprising:
dividing the determined input period into a preceding period and a following period by using the time point at which the change of the path is sensed as the reference; and
differently controlling amplitudes of signals in the preceding period and the following period.

4. The method as claimed in claim 3, comprising:
adjusting each slope of the amplitudes of the signals in the preceding period to be −1; and
adjusting each slope of the amplitudes of the signals in the following period to be 1.

5. The method as claimed in claim 1, wherein the input period is determined based on a first predetermined number of samples of the audio signal received before the reference and a second predetermined number of samples of the audio signal received after the reference.

6. An apparatus for reducing noise due to a change of a path for outputting an audio signal from a device, the apparatus comprising:
a controller configured to determine an input period for canceling the noise by using a time point, at which the change of the path for outputting the audio signal from the device is sensed, as a reference, when sensing the change of the path;
a filter configured to low-pass filter the audio signal in the determined input period; and
an interpolator configured to interpolate a first partial signal, which is the low-pass filtered audio signal in a first predetermined period that starts from a start time point of the determined input period, and to interpolate a second partial signal, which is the low-pass filtered audio signal in a second predetermined period that ends at an end time point of the determined input period, within the determined input period.

7. The apparatus as claimed in claim 6, wherein the interpolator is further configured to keep a remaining signal except for the first partial signal and the second partial signal to be unchanged from the audio signal low-pass filtered in the determined input period.

8. The apparatus as claimed in claim 7, further comprising an amplitude controller configured to divide the determined input period into a preceding period and a following period by using the time point at which the change of the path is sensed as the reference, and to differently control amplitudes of signals in the preceding period and the following period.

9. The apparatus as claimed in claim 8, wherein the amplitude controller is further configured to adjust each slope of the amplitudes of the signals in the preceding period to be −1, and to adjust each slope of the amplitudes of the signals in the following period to be 1.

10. The apparatus as claimed in claim 6, wherein the input period is determined based on a first predetermined number of samples of the audio signal received before the reference and a second predetermined number of samples of the audio signal received after the reference.

* * * * *